(12) United States Patent
Park et al.

(10) Patent No.: US 10,141,084 B2
(45) Date of Patent: Nov. 27, 2018

(54) ELECTRONIC DEVICE

(71) Applicants: Kyoung Soo Park, Uiwang-si (KR); Woo Suk Lee, Uiwang-si (KR); Woo Jun Lim, Uiwang-si (KR); Kyung Jin Lee, Uiwang-si (KR); Bong Yong Kim, Uiwang-si (KR); Jin Seong Park, Uiwang-si (KR); Dong Seon Uh, Uiwang-si (KR); Youn Jo Ko, Uiwang-si (KR); Jang Hyun Cho, Uiwang-si (KR); Sang Sik Bae, Uiwang-si (KR); Jin Kyu Kim, Uiwang-si (KR)

(72) Inventors: Kyoung Soo Park, Uiwang-si (KR); Woo Suk Lee, Uiwang-si (KR); Woo Jun Lim, Uiwang-si (KR); Kyung Jin Lee, Uiwang-si (KR); Bong Yong Kim, Uiwang-si (KR); Jin Seong Park, Uiwang-si (KR); Dong Seon Uh, Uiwang-si (KR); Youn Jo Ko, Uiwang-si (KR); Jang Hyun Cho, Uiwang-si (KR); Sang Sik Bae, Uiwang-si (KR); Jin Kyu Kim, Uiwang-si (KR)

(73) Assignee: Cheil Industries, Inc., Gumi-si, Kyeongsangbuk-do (KR)

( * ) Notice: Subject to any disclaimer, the term of this patent is extended or adjusted under 35 U.S.C. 154(b) by 672 days.

(21) Appl. No.: 13/834,349

(22) Filed: Mar. 15, 2013

(65) Prior Publication Data

US 2013/0213691 A1    Aug. 22, 2013

Related U.S. Application Data

(63) Continuation-in-part of application No. PCT/KR2010/009587, filed on Dec. 30, 2010, and a
(Continued)

(30) Foreign Application Priority Data

Oct. 8, 2010   (KR) .................. 10-2010-0098506
Dec. 31, 2010  (KR) .................. 10-2010-0140773

(51) Int. Cl.
   *H01L 23/52*    (2006.01)
   *H01B 3/08*     (2006.01)
   (Continued)

(52) U.S. Cl.
   CPC .............. *H01B 3/082* (2013.01); *C09J 7/10* (2018.01); *C09J 133/068* (2013.01); *H01B 7/00* (2013.01);
   (Continued)

(58) Field of Classification Search
   None
   See application file for complete search history.

(56) References Cited

U.S. PATENT DOCUMENTS 6,039,896 A    3/2000   Miyamoto et al.
7,700,007 B2   4/2010   Jung et al.
(Continued)

FOREIGN PATENT DOCUMENTS

JP    2000-234083 A    8/2000
JP    2004-111162 A    4/2004
(Continued)

OTHER PUBLICATIONS

Strong, Plastics Materials and Processing, 2000, Prentice-Hall, Inc., Second Edition, pp. 51-55.*
(Continued)

*Primary Examiner* — Elizabeth A Robinson
(74) *Attorney, Agent, or Firm* — Lee & Morse, P.C.

(57) ABSTRACT

An anisotropic conductive film, the anisotropic conductive film including an insulating layer and a conductive layer
(Continued)

laminated on the insulating layer, the conductive layer containing conductive particles, wherein after glass substrates are positioned to face each other on the upper and lower surface of the anisotropic conductive film and are pressed against the anisotropic conductive film at 3 MPa (based on the sample area) and 160° C. (based on the detection temperature of the anisotropic conductive film) for 5 sec, a ratio of the area of the insulating layer to that of the conductive layer is from about 1.3:1 to about 3.0:1.

8 Claims, 3 Drawing Sheets

Related U.S. Application Data continuation-in-part of application No. PCT/KR2011/004887, filed on Jul. 4, 2011.

(51) Int. Cl.
| | | |
|---|---|---|
| H01B 7/00 | (2006.01) | |
| H01B 13/00 | (2006.01) | |
| H01L 23/00 | (2006.01) | |
| C09J 133/06 | (2006.01) | |
| C09J 7/10 | (2018.01) | |
| C08K 3/08 | (2006.01) | |

(52) U.S. Cl.
CPC ............ *H01B 13/00* (2013.01); *H01L 24/26* (2013.01); *H01L 24/27* (2013.01); *H01L 24/29* (2013.01); *H01L 24/83* (2013.01); *C08K 3/08* (2013.01); *C09J 2201/36* (2013.01); *C09J 2201/602* (2013.01); *C09J 2201/606* (2013.01); *C09J 2203/326* (2013.01); *C09J 2205/102* (2013.01); *H01L 24/32* (2013.01); *H01L 2224/13099* (2013.01); *H01L 2224/2711* (2013.01); *H01L 2224/27436* (2013.01); *H01L 2224/294* (2013.01); *H01L 2224/2919* (2013.01); *H01L 2224/2929* (2013.01); *H01L 2224/2939* (2013.01); *H01L 2224/29083* (2013.01); *H01L 2224/29316* (2013.01); *H01L 2224/29339* (2013.01); *H01L 2224/29344* (2013.01); *H01L 2224/29347* (2013.01); *H01L 2224/29355* (2013.01); *H01L 2224/29499* (2013.01); *H01L 2224/32225* (2013.01); *H01L 2224/83191* (2013.01); *H01L 2224/83851* (2013.01); *H01L 2224/83862* (2013.01); *H01L 2924/07802* (2013.01); *H01L 2924/12044* (2013.01)

(56) References Cited

U.S. PATENT DOCUMENTS

| | | | |
|---|---|---|---|
| 9,574,045 B2* | 2/2017 | Yamada | C08G 59/38 |
| 2001/0021547 A1* | 9/2001 | Sakairi | H05K 3/323 |
| | | | 438/200 |
| 2003/0102466 A1* | 6/2003 | Kumakura | C09J 7/00 |
| | | | 252/511 |
| 2006/0148956 A1 | 7/2006 | Jung et al. | |
| 2010/0285305 A1* | 11/2010 | Akutsu | H01L 24/83 |
| | | | 428/323 |

FOREIGN PATENT DOCUMENTS

| | | | | |
|---|---|---|---|---|
| JP | 2005-146043 A | | 6/2005 | |
| JP | 2009074020 A | * | 4/2009 | |
| JP | 2009170898 A | | 7/2009 | |
| JP | WO 2010058782 A1 | * | 5/2010 | ............ H01L 24/83 |
| KR | 10 2006-0079064 A | | 7/2006 | |
| KR | 10 2009-0065462 A | | 6/2009 | |
| KR | 10 2010-0073595 A | | 7/2010 | |

OTHER PUBLICATIONS

Allcock et al., Contemporary Polymer Chemistry, 2003, Pearson Education, Inc., Third Edition, pp. 55-65.*
Office Action dated Oct. 24, 2014 in corresponding Chinese Patent Application No. 201080069406.5.
Korean Office Action in KR 10-2010-0138817, dated Apr. 29, 2013 (Park, et al.).
International Search Report in PCT/KR2010/009587, dated Oct. 7, 2011 (Park, et al.).

* cited by examiner

Hot Pressure

ELECTRONIC DEVICE

CROSS-REFERENCE TO RELATED APPLICATIONS

This application is a continuation-in-part of pending International Application No. PCT/KR2010/009587, entitled "ANISOTROPIC CONDUCTIVE FILM," which was filed on Dec. 30, 2010, and a continuation-in-part of pending International Application No. PCT/KR2011/004887, entitled "ANISOTROPIC CONDUCTIVE FILM," which was filed on Jul. 4, 2011, the entire contents of each of which are hereby incorporated by reference.

Korean Patent Application No. 10-2010-0098506, filed on Oct. 8, 2010, in the Korean Intellectual Property Office, and entitled: "ANISOTROPIC CONDUCTIVE FILM," and Korean Patent Application No. 10-2010-0140773, filed on Dec. 31, 2010, in the Korean Intellectual Property Office, and entitled: "ANISOTROPIC CONDUCTIVE FILM," are each incorporated by reference herein in their entirety.

BACKGROUND

1. Field

Embodiments relate to an electronic device.

2. Description of the Related Art

Anisotropic conductive films (ACFs) generally refer to films in which conductive particles, such as metal particles (e.g., nickel (Ni) or gold (Au) particles) or metal-coated polymer particles, are dispersed to conduct electricity in the z-axis direction and insulate in the x-y plane direction.

SUMMARY

Embodiments are directed to an electronic device, including an anisotropic conductive film, the anisotropic conductive film including an insulating layer and a conductive layer laminated on the insulating layer, the conductive layer containing conductive particles, wherein after glass substrates are positioned to face each other on the upper and lower surface of the anisotropic conductive film and are pressed against the anisotropic conductive film at 3 MPa (based on the sample area) and 160° C. (based on the detection temperature of the anisotropic conductive film) for 5 sec, a ratio of the area of the insulating layer to that of the conductive layer is from about 1.3:1 to about 3.0:1.

The conductive layer may have a lowest melt viscosity that is greater than that of the insulating layer.

The lowest melt viscosity of the conductive layer may be about 3,000 Pa·s greater than that of the insulating layer The lowest melt viscosity of the conductive layer may be about 3,000 to about 48,000 Pa·s greater than that of the insulating layer.

The insulating layer may be thicker than the conductive layer.

The insulating layer may be from about 1 to about 4 times thicker than the conductive layer.

The conductive layer or the insulating layer may include insulating particles.

The insulating particles may be present in an amount of about 0.1 to about 20% by weight, based on the total weight of a composition for the conductive layer or a composition for the insulating layer.

The amount (% by weight) of the insulating particles in the conductive layer with respect to the total weight of a composition for the conductive layer may be higher than that of the insulating particles in the insulating layer with respect to the total weight of a composition for the insulating layer.

The insulating particles may be present in an amount of about 2 to about 20% by weight, based on the total weight of a composition for the conductive layer.

The insulating particles may be present in an amount of about 0.1 to about 10% by weight, based on the total weight of a composition for the insulating layer.

The conductive layer may include about 1 to about 30% by weight of the conductive particles, based on the total weight of a composition for the conductive layer.

A composition for the conductive layer or a composition for the insulating layer may include a polymer resin, a radically polymerizable material, and a radical initiator.

The polymer resin may include one or more of an olefinic resin, a butadiene resin, an acrylonitrile-butadiene copolymer, a carboxyl-terminated acrylonitrile-butadiene copolymer, a polyimide resin, a polyamide resin, a polyester resin, a polyvinyl butyral resin, an ethylene-vinyl acetate copolymer, a styrene-butylene-styrene (SBS) resin, a styrene-ethylene-butylene-styrene (SEBS) resin, an acrylonitrile-butadiene rubbers (NBRs), a urethane resin, a (meth)acrylic resin, or a phenoxy resin.

Each of the conductive layer and the insulating layer may include a polymer resin having a molecular weight of about 50,000 to about 1,000,000.

The polymer resin may be present in an amount of about 20 to about 60% by weight, based on the total weight of a composition for the conductive layer.

The polymer resin may be present in an amount of about 30 to about 70% by weight, based on the total weight of a composition for the insulating layer.

The radically polymerizable material may include one or more of a (meth)acrylate monomer or oligomer or a urethane acrylate monomer or oligomer.

The radically polymerizable material may be present in an amount of about 20 to about 60% by weight, based on the total weight of the composition for the conductive layer or the composition for the insulating layer.

The radically polymerizable material may be present in an amount of about 0.5 to about 10% by weight, based on the total weight of the composition for the conductive layer or the composition for the insulating layer.

A composition for the conductive layer or a composition for the insulating layer may further include a silane coupling agent, and the silane coupling agent may be present in an amount of about 0.1 to about 5% by weight, based on the total weight of the composition for the conductive layer or the composition for the insulating layer.

Embodiments are also directed to an electronic device, including an anisotropic conductive film, the anisotropic conductive film including an insulating layer and a conductive layer laminated on the insulating layer, the conductive layer containing conductive particles, wherein after glass substrates are positioned to face each other on the upper and lower surface of the anisotropic conductive film to prepare a sample and are pressed against the anisotropic conductive film at 5 MPa (based on the sample area) and 185° C. (based on the detection temperature of the anisotropic conductive film) for 4 sec, the ratio of the area of the insulating layer to that of the conductive layer, based on an outermost particles of the conductive particles is from about 1.3:1 to about 3.0:1.

The conductive layer may have a melt viscosity at 100° C. that is higher than that of the insulating layer at 100° C.

A ratio of the melt viscosity of the conductive layer at 100° C. to that of the insulating layer at 100° C. may be from about 2:1 to about 100:1.

The conductive layer may include a binder system, a curable system, conductive particles, and a heat curing agent, the binder system may include a nitrile butadiene rubber resin, an acrylic resin, and a polyurethane resin, and the curable system may include a urethane acrylate and a (meth)acrylate monomer.

The conductive layer may include about 45 to about 80% by weight of the binder system, about 15 to about 40% by weight of the curable system, and about 0.5 to about 5% by weight of the heat curing agent.

The conductive layer may include about 45 to about 80% by weight of the binder system, about 15 to about 40% by weight of the curable system, about 0.5 to about 5% by weight of the heat curing agent, and about 1 to about 30% by weight of the conductive particles.

The conductive layer may include a binder system, a curable system, conductive particles, and a heat curing agent, and the binder system may include from 0 to about 40% by weight of a nitrile butadiene rubber resin, about 30 to about 70% by weight of an acrylic resin, and about 30 to about 70% by weight of a polyurethane resin, based on the solids content of the conductive layer.

The insulating layer may include a binder system, a curable system, and a heat curing agent, the binder system may include a nitrile butadiene rubber resin, an acrylic resin, and a polyurethane resin, and the curable system may include a urethane acrylate and a (meth)acrylate monomer.

The insulating layer may include about 20 to about 60% by weight of the binder system, about 35 to about 75% by weight of the curable system, and about 0.5 to about 5% by weight of the heat curing agent, based on the solids content of the insulating layer.

The insulating layer may include a binder system, a curable system, and a heat curing agent, and the binder system may include from 0 to about 25% by weight of a nitrile butadiene rubber resin, about 10 to about 60% by weight of an acrylic resin, and about 15 to about 90% by weight of the polyurethane resin, based on the solids content of the insulating layer.

BRIEF DESCRIPTION OF THE DRAWINGS

Features will become apparent to those of skill in the art by describing in detail example embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art.

In the drawing figures, the dimensions of layers and regions may be exaggerated for clarity of illustration. It will also be understood that when a layer or element is referred to as being "on" another layer or substrate, it may be directly on the other layer or substrate, or intervening layers may also be present. Further, it will be understood that when a layer is referred to as being "under" another layer, it may be directly under, and one or more intervening layers may also be present. In addition, it will also be understood that when a layer is referred to as being "between" two layers, it may be the only layer between the two layers, or one or more intervening layers may also be present. Like reference numerals refer to like elements throughout.

An electronic device according to an example embodiment includes an anisotropic conductive film. In an embodiment, the electronic device may include a tape carrier package, a display panel, and an anisotropic conductive film therebetween.

Figure 1:
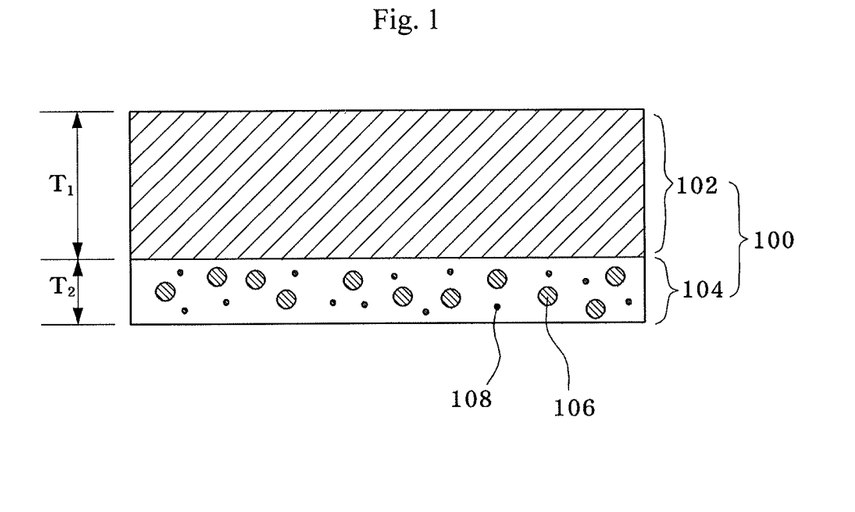
FIG. 1 illustrates a cross-sectional view of an anisotropic conductive film according to an example embodiment.
Figure 2:
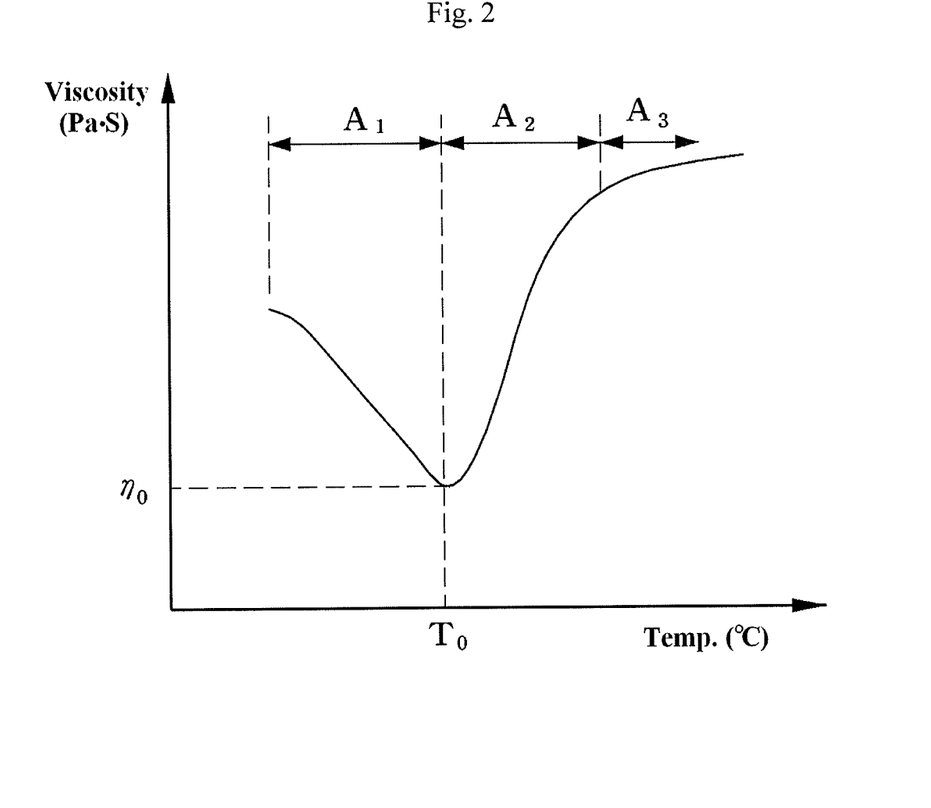
FIG. 2 illustrates a conceptual graph for explaining measurement of the lowest melt viscosity of a constituent layer of an anisotropic conductive film according to an example embodiment.

FIG. 1 is a cross-sectional view of an anisotropic conductive film 100 according to an example embodiment. FIG. 2 is a conceptual graph for explaining measurement of the lowest melt viscosity of a constituent layer of an anisotropic conductive film according to an example embodiment.

As illustrated in FIG. 1, the anisotropic conductive film 100 includes an insulating adhesive layer (hereinafter referred to simply as an 'insulating layer') 102 and a conductive adhesive layer (hereinafter referred to simply as a 'conductive layer') 104.

According to the present example embodiment, the anisotropic conductive film 100 may be formed such that the lowest melt viscosity $\eta_0$ of the conductive layer 104 is greater than $\eta_0$ of the insulating layer 102. In an embodiment, the lowest melt viscosity of the conductive layer 104 may be about 3,000 Pa·s, or about 3,000 to about 48,000 Pa·s, greater than that of the insulating layer 102. This melt viscosity difference may inhibit short-circuiting caused by the conductive particles of the conductive layer and make the insulating layer sufficiently flowable between circuit members, leading to high adhesive strength.

The lowest melt viscosity of the conductive layer 104 may be in the range of about 4,000 to about 50,000 Pa·s. The lowest melt viscosity of the insulating layer 102 may be in the range of about 2,000 to about 10,000 Pa·s. Within these ranges, short-circuiting caused by the conductive particles of the conductive layer may be inhibited and the insulating layer may be sufficiently flowable between circuit members, leading to high adhesive strength.

Referring to FIG. 2, the viscosity of a general adhesive decreases gradually at the initial stage of heating (zone $A_1$) with increasing temperature. The adhesive is melted at a certain point $T_0$, where it shows the lowest viscosity $\eta_0$. Thereafter, the adhesive is cured with increasing temperature (zone $A_2$) and becomes viscous. After completion of curing (zone $A_3$), the viscosity is constant. The lowest melt viscosity indicates the viscosity $\eta_0$ $\eta_0$ at $T_0$.

Referring again to the example embodiment shown in FIG. 1, the thickness $T_1$ of the insulating layer 102 may be larger than that that $T_2$ of the conductive layer 104. The ratio $T_1/T_2$ may be more than 1 and less than 4. Within this range, the insulating resin may be sufficiently filled between adjacent circuits, which may help achieve good insulation performance and adhesiveness.

The conductive layer 102 of the anisotropic conductive film may include conductive particles 106, which will be described below. The conductive layer 104 and/or the insulating layer 102 may include insulating particles 108, which will also be described below. In an implementation, the insulating particles 108 may be smaller in size (average particle diameter) than the conductive particles 106.

Figure 3:
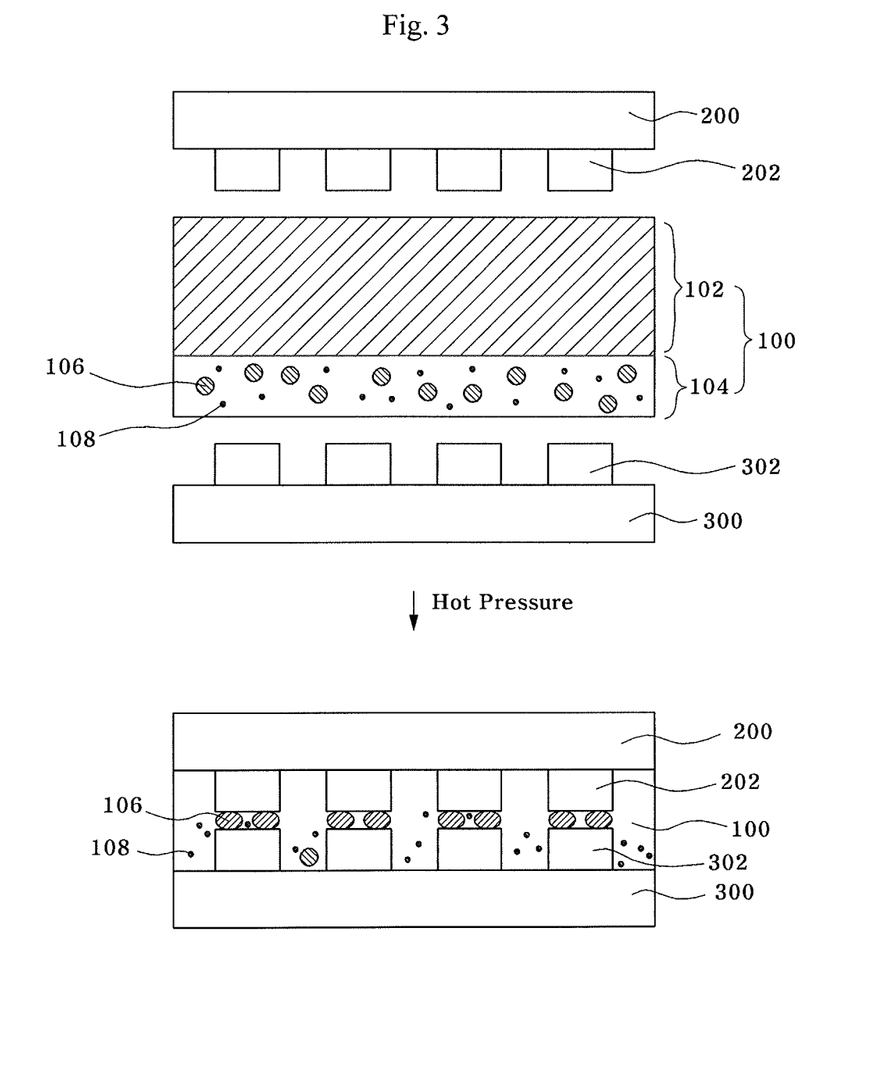
FIG. 3 illustrates a cross-sectional view for explaining a tape automated bonding (TAB) process using an anisotropic conductive film according to an example embodiment.

FIG. 3 is a cross-sectional view for explaining a tape automated bonding (TAB) process using an anisotropic conductive film according to an example embodiment. The TAB process may be used to connect a tape carrier package (TCP) to a display panel (for example, an LCD panel, an OLED panel, etc.) through an anisotropic conductive film in such a manner that driving integrated circuits (ICs) are mounted to the display panel. With reference to FIG. 3, after circuit terminals 202 of a TCP 200 and electrodes 302 of a display panel 300 are aligned, the anisotropic conductive film 100 is interposed therebetween, followed by hot pressing.

According to the present example embodiment, upon hot pressing, the insulating layer 102 of the anisotropic conductive film 100 is highly flowable due to its low viscosity and mainly flows into spaces where the circuit terminals 202 and the electrodes 302 do not face each other. Meanwhile, the matrix and the conductive particles 106 of the conductive layer 104, which are less flowable due to high viscosity, are predominantly located and pressed between the circuit terminals 202 and the electrodes 302. Thus, only a very small number of the conductive particles 106 may flow into spaces where the circuit terminals 202 and the electrodes 302 do not face each other. As a result, short-circuiting between the conductive particles 106 may be prevented. The insulating particles 108 may be located between the conductive particles 106 to further prevent short-circuiting between the conductive particles 106 and to reduce the transparency of the anisotropic conductive film, resulting in improved recognizability.

According to the present example embodiment, the area of the insulating layer 102 may be larger than that of the conductive layer 104 after pressing because the insulating layer is highly flowable due to its low viscosity. Specifically, after glass substrates are positioned to face each other on the upper and lower surface of the anisotropic conductive film and are pressed against the anisotropic conductive film at 3 MPa (based on the sample area) and 160° C. (based on the detection temperature of the anisotropic conductive film) for 5 sec, the ratio of the area of the insulating layer to that of the conductive layer based on the outermost particles (i.e. the conductive particles and the insulating particles) after pressing may be from about 1.4:1 to 3.0:1.

Hereinafter, compositions for the insulating layer and the conductive layer of an anisotropic conductive film according to an embodiment will be explained. Each of the compositions may include a polymer resin, a radically polymerizable material, a radical initiator, conductive particles, insulating particles, a coupling agent, other additives, etc.

(a) Polymer Resin

The polymer resin acts as a matrix of the film. The polymer resin may be, e.g., a thermoplastic resin, a thermosetting resin, or a combination thereof. Examples of suitable polymer resins include olefinic resins, such as polyethylene and polypropylene resins, butadiene resins, acrylonitrile-butadiene copolymers, carboxyl-terminated acrylonitrile-butadiene copolymers, polyimide resins, polyamide resins, polyester resins, polyvinyl butyral resins, ethylene-vinyl acetate copolymers, styrene-butylene-styrene (SBS) resins, styrene-ethylene-butylene-styrene (SEBS) resins, acrylonitrile-butadiene rubbers (NBRs), urethane resins, (meth) acrylic resins, and phenoxy resins. These polymer resins may be used alone or as a mixture of two or more thereof.

According to the present example embodiment, the polymer resin has a molecular weight of about 50,000 to about 1,000,000. Within this range, the lowest melt viscosities of the conductive layer and the insulating layer may be optimally controlled. The conductive layer includes about 20 to about 60% by weight of the polymer resin having a molecular weight of about 50,000 to about 1,000,000, based on the total weight of the composition for the conductive layer. The insulating layer includes about 10 to about 40% by weight of the polymer resin having a molecular weight of about 50,000 to about 1,000,000, based on the total weight of the composition for the insulating layer. The content (% by weight) of the polymer resin having a molecular weight of about 50,000 to about 1,000,000 in the insulating layer is lower than the content (% by weight) of the polymer resin having a molecular weight of about 50,000 to about 1,000,000 in the conductive layer. Due to this content difference, the conductive particles may be located between the circuit terminals, short-circuiting between the conductive particles may be prevented, and the connection resistance may be reduced.

The polymer resin may include an epoxy resin. The epoxy resin undergoes curing to guarantee good adhesive strength and high connection reliability between the layers to be connected to the anisotropic conductive film. The epoxy resin may be selected from, e.g., bisphenol epoxy resins, novolac epoxy resins, glycidyl epoxy resins, aliphatic epoxy resins, alicyclic epoxy resins, and mixtures thereof. The epoxy resin may be a combination an epoxy resin in the form of a solid at room temperature, an epoxy resin in the form of a liquid at room temperature, and optionally, a flexible epoxy resin. Examples of suitable solid epoxy resins include phenol novolac epoxy resins, cresol novolac epoxy resins, epoxy resins whose main skeleton is dicyclopentadiene, bisphenol A polymers, bisphenol F polymers, and modified epoxy resins. Examples of suitable liquid epoxy resins include bisphenol A epoxy resins, bisphenol F epoxy resins, and combinations thereof. Examples of suitable flexible epoxy resins include dimer acid modified epoxy resins, epoxy resins whose main skeleton is propylene glycol, and urethane modified epoxy resins.

(b) Radically Polymerizable Material

The radically polymerizable material is a component of the curable system that undergoes curing to help provide good adhesion and high connection reliability between the layers connected to the anisotropic conductive film. The radically polymerizable material may be, e.g., a (meth) acrylate oligomer, a (meth)acrylate monomer, or a mixture thereof.

(b-1) (Meth)acrylate Oligomer

Examples of suitable (meth)acrylate oligomers include oligomers of urethane (meth)acrylate, epoxy (meth)acrylate, polyester (meth)acrylate, fluorinated (meth)acrylate, fluorine (meth)acrylate, silicon (meth)acrylate, phosphoric acid (meth)acrylate, maleimide modified (meth)acrylate, and acrylate(methacrylate). These (meth)acrylate oligomers may be used alone or in a combination of two or more thereof.

The urethane (meth)acrylate oligomers may be those whose intermediate structures in the molecules are synthesized from polyester polyol, polyether polyol, polycarbonate polyol, polycaprolactone polyol, tetrahydrofuran-propylene oxide ring opening copolymers, polybutadiene diol, polydimethylsiloxane diol, ethylene glycol, propylene glycol, 1,4-butanediol, 1,5-pentanediol, 1,6-hexanediol, neopentyl glycol, 1,4-cyclohexane dimethanol, bisphenol A, hydrogenated bisphenol A, 2,4-toluene diisocyanate, 1,3-xylene diisocyanate, 1,4-xylene diisocyanate, 1,5-naphthalene diisocyanate, 1,6-hexane diisocyanate, and isophorone diisocyanate.

The epoxy (meth)acrylate oligomers may be those whose intermediate structures in the molecules are skeletons of 2-bromohydroquinone, resorcinol, catechol, bisphenols such as bisphenol A, bisphenol F, bisphenol AD, and bisphenol S, 4,4'-dihydroxybiphenyl and bis(4-hydroxyphenyl)ether. The (meth)acrylate oligomer may be selected from the group of those including alkyl, aryl, methylol, allyl, alicyclic, halogen (tetrabromobisphenol A, etc.), and nitro groups. Other (meth)acrylate oligomers may include those containing at least two maleimide groups in the molecules, for example, 1-methyl-2,4-bismaleimide benzene, N,N'-m-phenylenebismaleimide, N,N'-p-phenylenebismaleimide, N,N'-m-tolylenebismaleimide, N,N'-4,4-biphenylenebismaleimide, N,N'-4,4-(3,3'-dimethylbiphenylene)bismaleimide, N,N'-4,4-(3,3'-dimethyldiphenylmethane)bismaleimide, N,N'-4,4-(3,3'-diethyldiphenylmethane)bismaleimide, N,N'-4,4-diphenylmethanebismaleimide, N,N'-4,4-diphenylpropanebismaleimide, N,N'-4,4-diphenyl ether bismaleimide, N,N'-3,3'-diphenylsulfonebismaleimide, 2,2-bis(4-(4-maleimidephenoxy)phenyl)propane, 2,2-bis(3-s-butyl-4-8(4-maleimidephenoxy)phenyl)propane, 1,1-bis(4-(4-maleimidephenoxy)phenyl)decane, 4,4'-cyclohexylidene bis(1-(4-maleimidephenoxy)-2-cyclohexylbenzene and 2,2-bis(4-(4 maleimidephenoxy)phenyl)hexafluoropropane. These (meth)acrylate oligomers may be used alone or in a combination of two or more thereof.

(b-2) (Meth)acrylate Monomer

The radically curable composition may include a (meth)acrylate monomer as a radically polymerizable material. According to the present example embodiment, the (meth)acrylate monomer is another component of the curable system.

The (meth)acrylate monomer may be selected from the group of 1,6-hexanediol mono(meth)acrylate, 2-hydroxyethyl (meth)acrylate, 2-hydroxypropyl (meth)acrylate, 2-hydroxybutyl (meth)acrylate, 2-hydroxy-3-phenyl oxypropyl (meth)acrylate, 1,4-butanediol (meth)acrylate, 2-hydroxyalkyl (meth)acryloyl phosphate, 4-hydroxycyclohexyl (meth)acrylate, neopentyl glycol mono(meth)acrylate, trimethylolethane di(meth)acrylate, trimethylolpropane di(meth)acrylate, pentaerythritol tri(meth)acrylate, dipentaerythritol penta(meth)acrylate, pentaerythritol hexa(meth)acrylate, dipentaerythritol hexa(meth)acrylate, glycerin di(meth)acrylate, t-hydrofurfuryl (meth)acrylate, isodecyl (meth)acrylate, 2-(2-ethoxyethoxy)ethyl(meth)acrylate, stearyl(meth)acrylate, lauryl (meth)acrylate, 2-phenoxyethyl (meth)acrylate, isobornyl (meth)acrylate, tridecyl (meth)acrylate, ethoxylated nonylphenol (meth)acrylate, ethylene glycol di(meth)acrylate, diethylene glycol di(meth)acrylate, triethylene glycol di(meth)acrylate, t-ethylene glycol di(meth)acrylate, polyethylene glycol di(meth)acrylate, 1,3-butylene glycol di(meth)acrylate, tripropylene glycol di(meth)acrylate, ethoxylated bisphenol-A di(meth)acrylate, cyclohexanedimethanol di(meth)acrylate, phenoxy-t-glycol (meth)acrylate, 2-methacryloyloxyethyl phosphate, dimethylol tricyclodecane di(meth)acrylate, trimethylolpropanebenzoate acrylate, fluorene(meth)acrylate, and mixtures thereof.

The radically polymerizable material may be present in an amount of about 20 to about 60% by weight, based on the total weight of the composition for the conductive layer or the composition for the insulating layer. Within this range, good reliability after hot pressing and good contact performance, connection resistance and adhesion between the conductive particles and the circuit members upon adhesion may be obtained.

(c) Radical Initiator

The radical initiator may be selected from photopolymerization initiators, heat-curing initiators, and mixtures thereof. Specific examples of the photopolymerization initiators include benzophenone, methyl o-benzoyl benzoate, 4-benzoyl-4-methyl diphenyl sulfide, isopropylthioxanthone, diethylthioxanthone, ethyl 4-diethyl benzoate, benzoin ether, benzoyl propyl ether, 2-hydroxy-2-methyl-1-phenyl-propane-1-one, and diethoxyacetophenone.

As the heat-curing initiators, peroxide and azo initiators may be used. Specific examples of the peroxide initiators include t-butyl peroxylaurate, 1,1,3,3,-t-methylbutylperoxy-2-ethyl hexanoate, 2,5-dimethyl-2,5-di(2-ethylhexanoylperoxy)hexane, 1-cyclohexyl-1-methylethyl peroxy-2-ethyl hexanoate, 2,5-dimethyl-2,5-di(m-toluoylperoxy)hexane, t-butyl peroxyisopropyl monocarbonate, t-butyl peroxy-2-ethylhexyl monocarbonate, t-hexyl peroxybenzoate, t-butyl peroxyacetate, dicumyl peroxide, 2,5,-dimethyl-2,5-di(t-butylperoxy)hexane, t-butylcumyl peroxide, t-hexyl peroxyneodecanoate, t-hexyl peroxy-2-ethyl hexanoate, t-butyl peroxy-2-2-ethyl hexanoate, t-butyl peroxyisobutyrate, 1,1-bis(t-butylperoxy)cyclohexane, t-hexyl peroxyisopropyl monocarbonate, t-butyl peroxy-3,5,5-trimethyl hexanoate, t-butyl peroxypivalate, cumyl peroxyneodecanoate, diisopropyl benzenehydroperoxide, cumen hydroperoxide, isobutyl peroxide, 2,4-dichlorobenzoyl peroxide, 3,5,5-trimethylhexanoyl peroxide, octanoyl peroxide, lauryl peroxide, stearoyl peroxide, succinic peroxide, benzoyl peroxide, 3,5,5-trimethyl hexanoyl peroxide, benzoyl peroxytoluene, 1,1,3,3-tetramethyl butyl peroxyneodecanoate, 1-cyclohexyl-1-methylethyl peroxyneodecanoate, di-n-propyl peroxydicarbonate, diisopropyl peroxycarbonate, bis(4-t-butylcyclohexyl)peroxydicarbonate, di-2-ethoxymethoxy peroxydicarbonate, di(2-ethylhexylperoxy)dicarbonate, dimethoxybutyl peroxydicarbonate, di(3-methyl-3-methoxybutylperoxy)dicarbonate, 1,1-bis(t-hexylperoxy)-3,3,5-trimethylcyclohexane, 1,1-bis(t-hexylperoxy)cyclohexane, 1,1-bis(t-butylperoxy)-3,3,5-trimethylcyclohexane, 1,1-(t-butylperoxy)cyclododecane, 2,2-bis(t-butylperoxy)decane, t-butyltrimethylsilyl peroxide, bis(t-butyl)dimethylsilyl peroxide, t-butyltriallylsilyl peroxide, bis(t-butyl)diallylsilyl peroxide, and tris(t-butyl)arylsilyl peroxide.

Specific examples of the azo initiators include 2,2'-azobis(4-methoxy-2,4-dimethylvaleronitrile), dimethyl 2,2'-azobis(2-methylpropionate), 2,2'-azobis(N-cyclohexyl-2-methylpropionamide), 2,2-azobis(2,4-dimethylvaleronitrile), 2,2'-azobis(2-methylbutyronitrile), 2,2'-azobis[N-(2-propenyl)-2-methylpropionamide], 2,2'-azobis(N-butyl-2-methylpropionamide), 2,2'-azobis[N-(2-propenyl)-2-methylpropionamide], 1,1'-azobis(cyclohexane-1-carbonitrile), and 1-[(cyano-1-methylethyl)azo]formamide.

These initiators may be used alone or as a mixture of two or more thereof. The content of the radical initiator may be determined in a range that balances the curing ability in the adhesive and the preservative performance of the adhesive. The initiator may be present in an amount of about 0.5 to about 10% by weight, based on the total weight of the composition for the conductive layer or the composition for the insulating layer. This range may help ensure good curing rate, leading to superior hot pressing characteristics, and may enable removal of the anisotropic conductive film upon rework.

(d) Conductive Particles

According to the present example embodiment, the conductive particles are dispersed in the insulating adhesive to electrically connect members. The conductive particles are included in the conductive layer. The conductive particles may be metal particles, such as Au, Ag, Ni, Cu, and Pb particles, carbon particles, metal-coated polymer resin particles, or metal-coated polymer resin particles whose surface is insulated. Examples of the polymer resins include polyethylene, polypropylene, polyester, polystyrene and polyvinyl alcohol. Examples of the metals coated on the polymer resins include Au, Ag, Ni, Cu, and Pb.

In the case of outer lead bonding (OLB) where the surface of indium tin oxide (ITO) glass is an adherend, the cores of the conductive particles may be made of plastic materials to protect the ITO from damage by a pressure applied to connect the anisotropic conductive film to the adherend. In the case where the anisotropic conductive film is connected to a PCB, metal particles such as Ni particles may be used. In the case of a plasma display panel (PDP), metal particles (e.g., Ni particles) plated with gold (Au) may be used because a very high voltage is applied to circuits. In the case of chip on glass (COG) or narrow-pitched chip on film (COF), insulated conductive particles surface-covered with thermoplastic resins may be used.

The size of the conductive particles may be in the range of about 1 to about 3 µm, e.g., about 3 to about 20 µm, depending on the pitch of the circuits. The conductive particles may be present in an amount of about 1 to about 30% by weight, based on the total weight of the composition for the conductive layer or the composition for the anisotropic conductive film. This range may ensure stable connection reliability and may prevent electrical short-circuiting resulting from aggregation of the conductive particles between the pitches during hot pressing.

(e) Insulating Particles

The insulating particles may be inorganic particles, organic particles, or hybrid organic/inorganic particles. The insulating particles may be included in the insulating layer and/or the conductive layer. The insulating particles impart recognizability to the anisotropic conductive film and may prevent short-circuiting between the conductive particles.

Examples of the inorganic particles include ceramic particles such as silica ($SiO_2$), $Al_2O_3$, $TiO_2$, ZnO, MgO, $ZrO_2$, PbO, $Bi_2O_3$, $MoO_3$, $V_2O_5$, $Nb_2O_5$, $Ta_2O_5$, $WO_3$, and $In_2O_3$ particles. Mixtures of these organic particles may also be used. The organic particles may be, for example, acrylic beads. The hybrid organic/inorganic particles may be inorganic particles surface-coated with an organic material.

The silica particles may be produced by liquid phase processes, such as sol-gel and precipitation processes, and vapor phase processes, such as flame oxidation. The silica particles may be finely divided particles of silica gel or fused silica particles. The silica particles may be spherical, crushed, or edgeless in shape. The fused silica may be natural silica glass produced by melting natural quartz or silica with an arc discharge or an oxyhydrogen flame. The fused silica may be synthetic silica glass synthesized by pyrolysis of a gas raw material such as silicon tetrachloride or silane using an oxyhydrogen flame or oxygen plasma. A mixture of natural silica glass and synthetic silica glass may also be used.

If the insulating particles are larger in size (average particle diameter) than the conductive particles, there may be problems in electrical communication. Thus, the insulating particles may be smaller than the conductive particles. The average particle size of the insulating particles may be in the range of about 0.1 to about 20 µm, e.g., about 1 to about 10 µm, according to the intended applications. There is no restriction on the content of the insulating particles. The insulating particles may be present in an amount of about 0.1 to about 20% by weight, based on the total weight of the composition for the conductive layer or the composition for the insulating layer. The conductive layer or the insulating layer may not include insulating particles.

The content (% by weight) of the insulating particles in the conductive layer with respect to the total weight of the composition for the conductive layer may be higher than that of the insulating particles in the insulating layer with respect to the total weight of the composition for the insulating layer. Specifically, the conductive layer may include about 2 to about 20% by weight of the insulating particles, based on the total weight of the composition for the conductive layer, and the insulating layer may include about 0.1 to about 10% by weight of the insulating particles, based on the total weight of the composition for the insulating layer.

(f) Coupling Agent

The composition may further include a coupling agent that serves to enhance the adhesive strength between the surface of the inorganic material and the anisotropic conductive film and the resistance of the anisotropic conductive film to heat and humidity, resulting in an improvement in connection reliability. The coupling agent may be added in an amount of about 0.1 to about 5% by weight, e.g., about 0.1 to about 2% by weight, based on the total weight of the composition for the conductive layer or the composition for the insulating layer. Within this range, high cohesive strength of the adhesive composition may be achieved, thus helping to prevent deterioration in adhesive strength or reliability.

Examples of the silane coupling agent include: epoxy group-containing silane compounds, such as 2-(3,4-epoxycyclohexyl)ethyltrimethoxysilane, 3-glycidoxytrimethoxysilane and 3-glycidoxypropyltriethoxysilane; amine group-containing silane compounds, such as N-2-(aminoethyl)-3-aminopropylmethyldimethoxysilane, N-2-(aminoethyl)-3-aminopropyltrimethoxysilane, N-2-(aminoethyl)3-aminopropyltriethoxysilane, 3-aminopropyltrimethoxysilane, 3-aminopropyltriethoxysilane, 3-triethoxysilyl-N-(1,3-dimethylbutylidene)propylamine, and N-phenyl-3-aminopropyltrimethoxysilane; mercapto group-containing silane compounds, such as 3-mercaptopropylmethyldimethoxysilane and 3-mercaptopropyltriethoxysilane; and isocyanate group-containing silane compounds, such as 3-isocyanatopropyltriethoxysilane. These silane coupling agents may be used alone or as a mixture of two or more thereof.

(g) Other Additives

The compositions for the anisotropic conductive film consisting of the conductive layer and the insulating layer may include one or more additives selected from polymerization inhibitors, antioxidants, and heat stabilizers to impart additional physical properties to the anisotropic conductive film without sacrificing the basic physical properties of the anisotropic conductive film.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES 1A AND 2A AND COMPARATIVE EXAMPLES 1A, 2A, AND 3A

TABLE 1A

|  |  | Example 1A | | Example 2A | | Comparative Example 1A | | Comparative Example 2A | | Comparative Example 3A | |
|---|---|---|---|---|---|---|---|---|---|---|---|
|  |  | Insulating layer | Conductive layer | Insulating layer | Conductive layer | Insulating layer | Conductive layer | Insulating layer | Conductive layer | Insulating layer | Conductive layer |
| Polymer resins | Nipol 1072 | — | 10 | — | 10 | — | 10 | 10 | — | — | 10 |
|  | D-ACE-540T | 40 | 10 | 40 | 10 | 40 | 10 | 10 | 40 | 40 | 10 |
|  | E4275 | 10 | 25 | 10 | 25 | 10 | 25 | 33 | 2 | 5 | 20 |
| Radically polymerizable materials | Epoxy (meth)acrylate | 40 | 30 | 40 | 30 | 40 | 30 | 30 | 40 | 45 | 40 |
|  | 2-Methacryloyloxy ethyl phosphate | 2 | 2 | 2 | 2 | 2 | 2 | 2 | 2 | 2 | 2 |
|  | Pentaerythritol tri(meth)acrylate | 3 | 8 | 3 | 8 | 3 | 8 | 8 | 3 | 3 | 8 |
|  | 2-Hydroxyethyl (meth)acrylate | 3 | — | 2 | — | 3 | — | — | 3 | 3 | — |
| Radical initiators | Benzoyl peroxide | 2 | — | 2 | — | 2 | — | — | 2 | 2 | — |
|  | Lauryl peroxide | — | 2 | — | 2 | — | 2 | 2 | — | — | 2 |
| Conductive particles | Nickel powder | — | 8 | — | 8 | — | 8 | — | 8 | — | 8 |
| Insulating particles | Silica | — | 5 | — | 5 | — | 5 | 5 | — | — | — |
| Coupling agent | 3-Glycidoxypropyltriethoxy-silane | — | — | 1 | — | — | — | — | — | — | — |
| Film thickness (μm) |  | 25 | 10 | 25 | 10 | 10 | 25 | 25 | 10 | 25 | 10 |
| Lowest melt viscosity (kPa · s) |  | 2 | 7 | 2 | 7 | 2 | 7 | 9 | 2 | 1.5 | 4 |

Example 1A

A solution (solid content: 50%) of 40 wt % of a urethane resin (D-ACE-540T, Dongsung Chemical (Korea)) in toluene, a solution (solid content: 40%) of 10 wt % of a phenoxy resin (E4275, Japan Epoxy Resins Co., Ltd.) in methyl ethyl ketone (MEK), 40 wt % of epoxy (meth)acrylate (SP1509, Showa Highpolymer), 2 wt % of 2-methacryloyloxyethyl phosphate, 3 wt % of pentaerythritol tri(meth)acrylate, 3 wt % of 2-hydroxyethyl (meth)acrylate, and 2 wt % of benzoyl peroxide were used to form a 25 μm thick insulating adhesive layer having a lowest melt viscosity of 2,000 Pa·s.

A solution (solid content: 25%) of 10 wt % of an acrylonitrile-butadiene resin (Nipol 1072, Nippon Zeon) in toluene, a solution (solid content: 50%) of 10 wt % of a urethane resin (D-ACE-540T, Dongsung Chemical (Korea)) in toluene, a solution (solid content: 40%) of 25 wt % of a phenoxy resin (E4275, Japan Epoxy Resins Co., Ltd.) in MEK, 30 wt % of epoxy (meth)acrylate (SP1509, Showa Highpolymer), 2 wt % of 2-methacryloyloxyethyl phosphate, 8 wt % of pentaerythritol tri(meth)acrylate, 2 wt % of lauryl peroxide, 8 wt % of nickel powder having an average particle diameter of 4.5 pm and 5 wt % of fused silica having an average particle diameter of 1 pm were used to form a 10 μm thick conductive adhesive layer having a lowest melt viscosity of 7,000 Pa·s. The insulating adhesive layer and the conductive adhesive layer were laminated to produce a 35 μm thick anisotropic conductive film. The anisotropic conductive film was slit into 2 mm wide samples.

Example 2A

An anisotropic conductive film was produced in the same manner as in Example 1A, except that 2-hydroxyethyl (meth)acrylate and 3-glycidoxypropyl triethoxy silane were used in amounts of 2 wt % and 1 wt %, respectively, to form an insulating adhesive layer having a lowest melt viscosity of 2,000 Pa·s.

Comparative Example 1A

An anisotropic conductive film was produced in the same manner as in Example 1A, except that the thicknesses of the insulating adhesive layer and the conductive adhesive layer were changed to 10 μm and 25 μm, respectively.

Comparative Example 2A

A solution (solid content: 25%) of 10 wt % of an acrylonitrile butadiene resin (Nipol 1072, Nippon Zeon) in toluene, a solution (solid content: 50%) of 10 wt % of a urethane resin (D-ACE-540T, Dongsung Chemical (Korea)) in toluene, a solution (solid content: 40%) of 33 wt % of a phenoxy resin (E4275, Japan Epoxy Resins Co., Ltd.) in MEK, 30 wt % of epoxy (meth)acrylate (SP1509, Showa Highpolymer), 2 wt % of 2-methacryloyloxyethyl phosphate, 8 wt % of pentaerythritol tri(meth)acrylate, 2 wt % of lauryl peroxide and 5 wt % of fused silica having an average particle diameter of 1 μm were used to form a 25 μm thick insulating adhesive layer having a lowest melt viscosity of 9,000 Pa·s.

A solution (solid content: 50%) of 40 wt % of a urethane resin (D-ACE-540T, Dongsung Chemical (Korea)) in toluene, a solution (solid content: 40%) of 2 wt % of a phenoxy resin (E4275, Japan Epoxy Resins Co., Ltd.) in MEK, 40 wt % of epoxy (meth)acrylate (SP1509, Showa Highpolymer), 2 wt % of 2-methacryloyloxyethyl phosphate, 3 wt % of pentaerythritol tri(meth)acrylate, 3 wt % of 2-hydroxyethyl (meth)acrylate, 2 wt % of benzoyl peroxide and 8 wt % of nickel powder having an average particle diameter of 4.5 pm were used to form a 10 μm thick conductive adhesive layer having a lowest melt viscosity of 2,000 Pa·s.

The insulating adhesive layer and the conductive adhesive layer were laminated to produce an anisotropic conductive film.

Comparative Example 3A

A 25 μm thick insulating adhesive layer having a lowest melt viscosity of 1,500 Pa·s was formed in the same manner as in Example 1A, except that a solution (solid content: 40%) of 5 wt % of a phenoxy resin (E4275, Japan Epoxy Resins Co., Ltd.) in MEK and 45 wt % of epoxy (meth) acrylate (SP1509, Showa Highpolymer) were used.

A 10 μm thick conductive adhesive layer having a lowest melt viscosity of about 4,000 Pa·s was formed in the same manner as in Example 1A, except that a solution (solid content: 40%) of 20 wt % of a phenoxy resin (E4275, Japan Epoxy Resins Co., Ltd.) in MEK and 40 wt % of epoxy (meth)acrylate (SP1509, Showa Highpolymer) were used and silica was not used.

The insulating adhesive layer and the conductive adhesive layer were laminated to produce an anisotropic conductive film.

The characteristics of the anisotropic conductive films produced in Examples 1A and 2A and Comparative Examples 1A, 2A, and 3A were evaluated by the following methods. The results are shown in Table 2A.

[Lowest Melt Viscosity]

The lowest melt viscosity values were measured using an ARES G2 rheometer (TA
  Instruments) under the following conditions:
  Heat rate: 10° C./min
  Strain: 5%
  Frequency: 1 rad/s
  Temperature zone: 30-200° C.

For measurement, a parallel plate and an aluminum disposable plate (diameter: 8 mm) were used.

Adhesive Strength And Connection Resistance

A PCB (terminal width: 100 μm, interval between terminals: 100 μm) and COF (terminal width: 100 μm, interval between terminals: 100 μm) were used to evaluate the performance of the anisotropic conductive films. The PCB and the COF had pitches of 200 μm. After each of the anisotropic conductive films was preliminarily pressed against the circuit terminals of the PCB at 1 MPa and 70° C. for 1 sec, a release film was removed. Subsequently, the circuit terminals of the COF were positioned to face the circuit terminals of the PCB, followed by hot pressing at 3.0 MPa and 160° C. for 5 sec to produce a specimen. The specimen was measured for 90° adhesive strength and connection resistance. After storage at a temperature of 85° C. and a relative humidity of 85% for 500 hr, the connection resistance of the specimen was measured.

The adhesive strength of the specimen was measured using a universal testing machine (UTM) (H5KT, TINIUS OLSEN) and the connection resistance of the specimen was measured using MULTIMETER 2000 (KEITHLEY).

Recognizability

Images of the anisotropic conductive film preliminarily pressed against the PCB terminals were taken using a microscope (BX51, OLYMPUS) and brightness values thereof were scored from 0 (black) to 255 (white). The anisotropic conductive film was judged to be recognizable when the brightness of the anisotropic conductive film was at least 20% lower than that of the PCB terminals.

Area Ratio After Pressing

Glass substrates were placed on and under a sample (size: 2 mm×10 mm) of each of the anisotropic conductive films, followed by pressing at 3 MPa (based on the sample area) and 160° C. (based on the detection temperature of the anisotropic conductive film) for 5 sec. After pressing, the ratio of the area of the insulating layer to that of the conductive layer (based on the outermost particles) was measured.

TABLE 2A

| | | Example 1A | Example 2A | Comparative Example 1A | Comparative Example 2A | Comparative Example 3A |
|---|---|---|---|---|---|---|
| Adhesive strength (gf/cm) | | 903 | 1066 | 658 | 723 | 789 |
| Connection | 0 hr | 0.30 | 0.31 | 0.30 | 0.32 | 0.31 |
| resistance (Ω) | 500 hr | 0.40 | 0.43 | 0.51 | 1.18 | 0.48 |
| Recognizability | | Good | Good | Good | Good | Poor |
| Area ratio after pressing | | 1.6 | 1.6 | 1.2 | 1.1 | 1.3 |

In each of the anisotropic conductive films produced in Examples 1A and 2A, the lowest melt viscosity of the conductive layer was greater than that of the insulating layer and the thickness of the insulating layer was larger than the conductive layer. In the anisotropic conductive film of Comparative Example 2A, the lowest melt viscosity of the insulating layer was greater than that of the conductive layer. As may be seen from the results in Table 2A, the anisotropic conductive films of Examples 1A and 2A showed better characteristics in terms of adhesive strength, connection resistance, and recognizability, whereas the anisotropic conductive film of Comparative Example 2A showed a lower adhesive strength and a higher connection resistance. Particularly, the anisotropic conductive film of Comparative Example 2A had a very high connection resistance after storage at a temperature of 85° C. and a relative humidity of 85% for 500 hr, indicating poor reliability of the film. In the anisotropic conductive film of Comparative Example 1A, the insulating layer was thinner than the conductive layer. The anisotropic conductive film of Comparative Example 1A had a very low adhesive strength and a high connection resistance.

In the anisotropic conductive film of Comparative Example 3A, the difference in lowest melt viscosity between the insulating layer and the conductive layer was 2,500 Pa·s. The anisotropic conductive film of Comparative Example 3A had a low adhesive strength and a high connection resistance after storage at a temperature of 85° C. and a relative humidity of 85% for 500 hr, indicating very poor reliability of the film. The anisotropic conductive film of Comparative Example 3A had the same thickness as the anisotropic conductive films of Examples 1-2, but it showed poor recognizability, which is believed to be due to the absence of silica particles as insulating particles.

As is apparent from the foregoing, the anisotropic conductive film according to the present example embodiment may be constructed such that the lowest melt viscosity of the conductive layer is greater than that of the insulating layer. Due to this construction, short-circuiting between the conductive particles may be prevented and the connection resistance may be reduced. In addition, the anisotropic conductive film may be constructed such that the insulating layer is thicker than the conductive layer and contains insulating particles. This may help provide sufficient adhesion strength between circuit members and lead to markedly improved recognizability. The anisotropic conductive film according to the present example embodiment may exhibit low connection resistance, good adhesive strength, and good recognizability, and may be applied to various electronic devices, including flat panel displays for monitors, TVs, notebooks, tablet PCs, and mobile phones, which require electrical connection.

Additional Embodiments

1: Insulating adhesive layer, 2: Conductive adhesive layer, 3: Base film or Release film, 4: Conductive particles.

Figure 4:
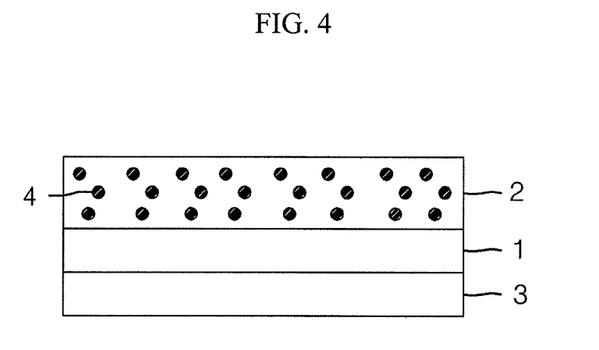
FIG. 4 illustrates a cross-sectional view of a general multilayered anisotropic conductive film.

FIG. 4 illustrates a general multilayered anisotropic conductive film. As illustrated in FIG. 4, the anisotropic conductive film has a multilayer structure in which an insulating adhesive layer 1 and a conductive adhesive layer 2 are sequentially laminated on a release film 3 such as a polyethylene terephthalate film. The conductive adhesive layer 2 contains conductive particles 4 and has a higher melt viscosity than the insulating adhesive layer 1. When the multilayered film is connected between glass and a chip on film (COF) (or a flexible printed circuit board (fPCB)), the conductive adhesive layer having a relatively high melt viscosity is contacted with the glass and the insulating adhesive layer having a relatively low melt viscosity is contacted with the COF (or fPCB).

An embodiment may provide an electronic device that includes an anisotropic conductive film that includes an insulating adhesive layer (which may be referred to simply as an 'insulating layer') and a conductive adhesive layer (which may be referred to simply as a 'conductive layer') laminated on the insulating layer and containing conductive particles. After glass substrates are positioned to face each other on the upper and lower surface of the anisotropic conductive film to prepare a sample and are pressed against the anisotropic conductive film at 5 MPa (based on the sample area) and 185° C. (based on the detection temperature of the anisotropic conductive film) for 4 sec, the ratio of the area of the insulating layer to that of the conductive layer is from about 1.31:1 to 3.0:1.

The area of the conductive layer and the area of the insulating layer is respectively an area of the area of the conductive layer and the area of the insulating layer based on the outermost particles of the conductive particles included in the conductive layer.

The electronic device is not limited, and may include a displaying device including flat panel displays for monitors, TVs, notebooks, tablet PCs and mobile phones, which require electrical connection.

Figure 6:
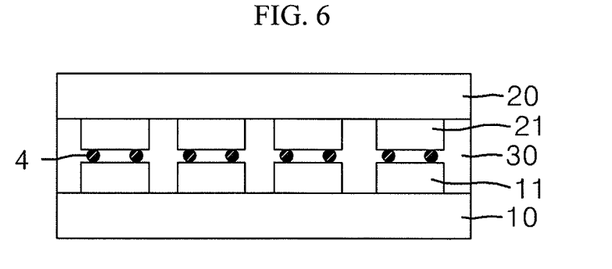
FIG. 6 illustrates a cross-sectional view of an electronic device according to an example embodiment.

FIG. 6 illustrates a cross-sectional view of an electronic device according to an example embodiment.

Regarding FIG. 6, the device may include a first member (10) including a first circuit terminal (11), a second member (20) including a second circuit terminal (21) and opposed with the first member (10), and an anisotropic conductive film (30) including conductive particles (4) and positioned between the first member (10) and the second member (20).

The first member and the second member may be one or more of COF, glass, and the like.

The anisotropic conductive film may include a conductive layer and an insulating layer formed on the conductive layer. The melt viscosity of the conductive layer at 100° C. may be higher than that of the insulating layer at 100° C.

In an implementation, the ratio of the melt viscosity of the conductive layer at 100° C. to that of the insulating layer at 100° C. is from about 2:1 to about 100:1.

Figure 5:
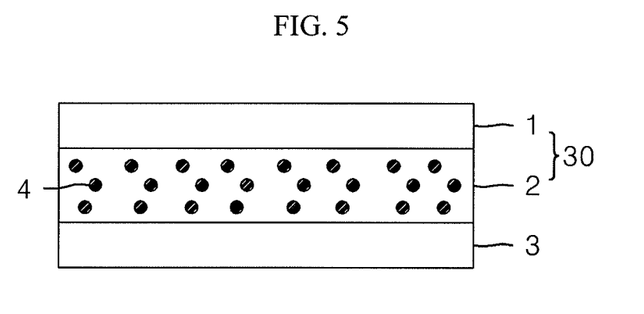
FIG. 5 illustrates a cross-sectional view of an anisotropic conductive film according to an example embodiment.

FIG. 5 illustrates the structure of an anisotropic conductive film according to an example embodiment. As illustrated in FIG. 5, the anisotropic conductive film (30) may include a conductive layer (2) and an insulating layer (1) which is sequentially laminated on the conductive layer (2), the anisotropic conductive film (30) may be formed on a base film (3) such as a polyethylene terephthalate film. According to the present example embodiment, the conductive layer 2 contains conductive particles 4 and has a higher melt viscosity than the insulating layer 1.

The melt viscosities of the conductive layer and the insulating layer are measured at a strain of 5% and a frequency of 1 rad/s using a parallel plate and a disposable aluminum plate (diameter=8 mm) while increasing the temperature from 30 to 180° C. at a rate of 10° C./min. In the anisotropic conductive film, the values determined at 100° C. are defined as the melt viscosities of the conductive layer and the insulating layer.

The ratio of the melt-viscosity may be adjusted to about 2:1 to about 100:1 by varying the melt viscosities of the conductive layer and the insulating layer. When the ratio of the melt-viscosity at 100° C. falls within the range noted above, the insulating layer may reside in spaces between circuit terminals upon bonding due to its high flowability and the conductive particles present in the conductive layer may be positioned on the desired circuit terminals. The ratio of the melt-viscosity may be from about 5:1 to about 50:1.

The conductive layer may have a melt viscosity of about 50 to about 100,000 Pa·s at 100° C.

The insulating layer may have a melt viscosity of about 10 to about 1,000 Pa·s at 100° C.

The ratio of the melt-viscosity may be adjusted to the range noted above by fixing the melt viscosity of the insulating layer and varying the melt viscosity of the conductive layer. The melt viscosity of the conductive layer may be varied by controlling the contents of a polyurethane binder, an acrylic binder, and a nitrile butadiene rubber (NBR) resin, which are included in a binder system of the conductive layer, and the content of a urethane acrylate included in a curable system of the conductive layer.

Details will now be given of the base film, the conductive layer, and the insulating layer of the anisotropic conductive film.

Base Film

A polyolefin-based film may be used as the base film. Examples of materials suitable for the polyolefin-based film include polyethylene, polypropylene, ethylene/propylene copolymers, polybutene-1, ethylene/vinyl acetate copolymers, polyethylene/styrene butadiene rubber blends, and polyvinyl chloride. Polymers such as polyethylene terephthalate, polycarbonate, and poly(methyl methacrylate), thermoplastic elastomers such as polyurethane and polyamide-polyol copolymers, and mixtures thereof may also be used.

The thickness of the base film may be, for example, from about 10 to about 50 μm.

Conductive Layer

The conductive layer may include a binder system, a curable system, and a heat curing agent.

The conductive layer may include about 45 to about 80% by weight of the binder system, about 15 to about 40% by weight of the curable system, and about 0.5 to about 5% by weight of the heat curing agent.

The binder system acting as a matrix of the film may include a nitrile butadiene rubber (NBR) resin, an acrylic resin, and a polyurethane resin.

The binder system may include 0 to about 40% by weight of the NBR resin, about 30 to about 70% by weight of the acrylic resin, and about 30 to about 70% by weight of the polyurethane resin.

The NBR resin is a copolymer prepared by emulsion polymerization of acrylonitrile and butadiene. The contents of the acrylonitrile and the butadiene in the copolymer and the polymerization method may be appropriately selected. The NBR resin may have a weight average molecular weight of about 50,000 to about 2,000,000 g/mol.

The NBR resin may be present in an amount of 0 to about 10% by weight, based on the solids content of the conductive layer. Within this range, the film may be satisfactorily formed. The NBR resin may be present in an amount of about 5 to about 10% by weight.

The acrylic resin may be prepared by polymerization of an acrylic monomer, and optionally a monomer polymerizable with the acrylic monomer. For example, the acrylic resin may be prepared by polymerization of at least one monomer selected from the group of (meth)acrylates having at least one $C_2$-$C_{10}$ alkyl group, (meth)acrylic acids, vinyl acetate, and modified acrylic monomers thereof. The polymerization method may be appropriately selected.

The acrylic resin may be present in an amount of 0 to about 40% by weight, based on the solids content of the conductive layer. Within this range, the film may be satisfactorily formed and the melt-viscosity ratio noted above may be obtained. The acrylic resin may be present in an amount of about 20 to about 28% by weight.

The polyurethane resin is a polymer resin that has urethane bonds and may be prepared by polymerization of isophorone diisocyanate, polytetramethylene glycol, etc. Monomers for the polyurethane resin may be appropriately selected. The polyurethane resin may have a weight average molecular weight of about 50,000 to about 100,000 g/mol.

The polyurethane resin may be present in an amount of 0 to about 40% by weight, based on the solids content of the conductive layer. Within this range, the film may be satisfactorily formed and the melt-viscosity ratio noted above may be obtained. The polyurethane resin may be present in an amount of about 36 to about 40% by weight.

The curable system may include at least one compound selected from the group of a urethane acrylate and a (meth)acrylate monomer. In an example embodiment, the curable system includes a urethane acrylate.

The urethane acrylate includes a urethane bond and double bonds at both ends. The urethane acrylate may be prepared by polymerization of a diisocyanate, glycol, etc. The polymerization method for the preparation of the urethane acrylate may be appropriately selected.

The urethane acrylate may have a weight average molecular weight of about 500 to about 30,000 g/mol. Within this range, the film may be satisfactorily formed and may be highly compatible.

The urethane acrylate may be present in an amount of about 12 to about 50% by weight, based on the solids content of the conductive layer. Within this range, the anisotropic conductive film may be highly compatible. The urethane acrylate may be present in an amount of about 12 to about 24% by weight.

The (meth)acrylate monomer mayserve as a reactive diluent in the anisotropic conductive film composition. The (meth)acrylate monomer may be selected from the group of, e.g., 1,6-hexanediol mono(meth)acrylate, 2-hydroxyethyl (meth)acrylate, 2-hydroxypropyl (meth)acrylate, 2-hydroxybutyl (meth)acrylate, 2-hydroxy-3-phenyloxypropyl (meth)acrylate, 1,4-butanediol (meth)acrylate, 2-hydroxyethyl (meth)acryloyl phosphate, 4-hydroxycyclohexyl (meth)acrylate, neopentyl glycol mono(meth)acrylate, trimethylolethane di(meth)acrylate, trimethylolpropane di(meth)acrylate, pentaerythritol tri(meth)acrylate, dipentaerythritol penta(meth)acrylate, pentaerythritol hexa(meth)acrylate, dipentaerythritol hexa(meth)acryl ate, glycerin di(meth)acrylate, hydrofurfuryl (meth)acrylate, isodecyl (meth)acryl ate, 2-(2-ethoxyethoxy)ethyl (meth)acrylate, stearyl (meth)acrylate, lauryl (meth)acrylate, 2-phenoxyethyl (meth)acrylate, isobornyl (meth)acrylate, tridecyl (meth)acrylate, ethoxylated nonylphenol (meth)acrylate, ethylene glycol di(meth)acrylate, triethylene glycol di(meth)acrylate, tetraethylene glycol di(meth)acrylate, polyethylene glycol di(meth)acrylate, 1,3-butylene glycol di(meth)acrylate, tripropylene glycol di(meth)acrylate, ethoxylated bisphenol-A di(meth)acrylate, cyclohexanedimethanol di(meth)acrylate, phenoxy-t-glycol (meth)acrylate, 2-methacryloyloxymethyl phosphate, 2-methacryloyloxyethyl phosphate, dimethyloltricyclodecane di(meth)acrylate, trimethylolpropane benzoate acrylate, and mixtures thereof. The reactive diluent may be present in an amount of about 5 to about 50% by weight, based on the solids content of the conductive layer. For example, the reactive diluent may be present in an amount of about 5 to about 10% by weight.

The anisotropic conductive film may include a radical initiator. The radical initiator may be a photopolymerization initiator, a heat curing agent, or a combination thereof In an implementation, the radical initiator is a heat curing agent.

The heat curing agent may be present in an amount of about 0.5 to about 5% by weight, based on the solids content of the conductive layer. Within this range, sufficient reactions for curing may take place to provide an appropriate molecular weight, and as a result, excellent physical properties in terms of adhesive strength and reliability may be expected after bonding.

Examples of heat curing agents suitable for use in the conductive layer include peroxide and azo initiators. Examples of such peroxide initiators include lauryl peroxide, benzoyl peroxide, and cumene hydroperoxide. Examples of such azo initiators include 2,2'-azobis(4-methoxy-2,4-dimethylvaleronitrile), dimethyl 2,2'-azobis(2-methylpropionate), and 2,2'-azobis(N-cyclohexyl-2-methylpropionamide).

The conductive layer may further include conductive particles. In this case, the conductive layer may include about 45 to about 80% by weight of the binder system, about 15 to about 40% by weight of the curable system, about 0.5 to about 5% by weight of the heat curing agent, and about 1 to about 30% by weight of the conductive particles.

The conductive particles may serve as fillers and impart conductive performance to the conductive layer.

The conductive particles may be present in an amount of about 1 to about 30% by weight, based on the solids content of the conductive layer. Within this range, suitable electrical communication may be established while reducing the danger of short circuiting. The content of the conductive particles may be determined depending on the application of the anisotropic conductive film. In an implementation, the conductive particles are present in an amount of about 1 to about 5% by weight.

Examples of conductive particles suitable for use in the conductive layer may include: metal particles, such as gold (Au), silver (Ag), nickel (Ni), copper (Cu), and solder metal particles; carbon particles; metal-coated resin particles, such as particles of polyethylene, polypropylene, polyester, polystyrene, polyvinyl alcohol and their modified resins coated with gold (Au), silver (Ag), nickel (Ni), copper (Cu), and solder metal; and conductive particles coated with insulating particles.

The diameter of the conductive particles may be, e.g., in the range of about 1 to about 20 μm in terms of adhesive strength and connection reliability.

The conductive layer may have a melt viscosity of about 50 to about 100,000 Pa·s at 100° C. Within this range, the conductive layer may be sufficiently viscous to minimize the flow of the conductive particles, which may help position a larger number of the conductive particles on electrodes. The melt viscosity of the conductive layer may be from about 500 to about 10,000 Pa·s. For example, the melt viscosity of the conductive layer be about 5 to about 100 times higher than that of the insulating layer.

The thickness of the conductive layer may be appropriately selected according to the size of the conductive particles. For example, when the conductive particles have a size of 3 μm, the conductive particles may have a thickness of about 4 to about 6 μm.

Insulating Layer

The insulating layer may include a binder system, a curable system, and a heat curing agent.

The insulating layer may include about 20 to about 60% by weight of the binder system, about 35 to about 75% by weight of the curable system, and about 0.5 to about 5% by weight of the heat curing agent.

The binder system may act as a matrix of the film. The binder system may include a nitrile butadiene rubber (NBR) resin, an acrylic resin, and a polyurethane resin.

The binder system may include 0 to about 25% by weight of the NBR resin, about 10 to about 60% by weight of the acrylic resin, and about 15 to about 90% by weight of the polyurethane resin, based on the solids content of the insulating layer.

Details of the NBR resin, the acrylic resin, and the polyurethane resin are the same as those described in the conductive layer.

The binder system may include the NBR resin, the acrylic resin, and the polyurethane resin in amounts of 0 to about 10% by weight, 0 to about 40% by weight, and 0 to about 40% by weight, respectively, based on the solids contents of the insulating layer. Within these ranges, the film may be satisfactorily formed. In an implementation, the NBR resin, the acrylic resin, and the polyurethane resin are present in amounts of about 5 to about 10% by weight, about 5 to 15% by weight, and about 10 to about 30% by weight, respectively.

The curable system may include at least one compound selected from the group of urethane acrylates and (meth) acrylate monomers. In an implementation, the curable system includes a urethane acrylate and a (meth)acrylate monomer.

The urethane acrylate may be present in an amount of about 40 to about 80% by weight, based on the solids content of the insulating layer. Within this range, the film may have the melt viscosity noted above. In an implementation, the urethane acrylate is present in an amount of 40 to about 60% by weight.

The (meth)acrylate monomer may be present in an amount of about 5 to about 50% by weight, based on the solids content of the insulating layer. Within this range, appropriate curing reactions may take place after bonding, which may impart high adhesive strength and high reliability to the anisotropic conductive film. In an implementation, the (meth)acrylate monomer is present in an amount of about 5 to about 10% by weight.

The heat curing agent may be present in an amount of about 0.5 to about 5% by weight, based on the solids content of the insulating layer. Within this range, sufficient reactions for curing may take place to provide an appropriate molecular weight, and as a result, excellent physical properties in terms of adhesive strength and reliability may be expected after bonding. In an implementation, the heat curing agent is present in an amount of about 1 to about 3% by weight.

The insulating layer may have a melt viscosity of about 10 to about 1,000 Pa·s at 100° C. Within this range, the insulating layer may be sufficiently flowable to allow the conductive particles of the conductive layer to be compressed between electrodes upon bonding without causing problems. In an implementation, the insulating layer has a melt viscosity of about 50 to about 500 Pa·s.

The thickness of the insulating layer may be determined depending on the size and the interval of spaces between electrodes and may be, e.g., from about 6 to about 20 μm.

Embodiments may also provide a method of producing an anisotropic conductive film. The method may include laminating a conductive layer on a base film and laminating an insulating layer on the conductive layer.

Details of the base film, the conductive layer, and the insulating layer are the same as those described above.

Embodiments may also provide a method of pressing an anisotropic conductive film. In the present example embodiment, the anisotropic conductive film has a structure in which a conductive layer and an insulating layer are sequentially laminated on a base film. In an example embodiment, the method includes preliminarily pressing the anisotropic conductive film to bring the insulating layer into contact with first circuit terminals, for example, PCB terminals, removing the base film, and bringing the conductive layer into contact with second circuit terminals such as COF terminals by final pressing to connect the first circuit terminals to the second circuit terminals. For example, the preliminary pressing may be performed under about 1 to about 2 MPa at 60 to 80° C. for about 1 to about 2 sec, and the final pressing may be performed under about 2 to about 5 MPa at 180 to 190° C. for about 4 to about 10 sec.

Embodiments may also provide a method of pressing circuit terminals including preliminarily pressing the anisotropic conductive film to bring the insulating layer into contact with first circuit terminals, removing the base film, and bringing the conductive layer into contact with second circuit terminals by final pressing to connect the first circuit terminals to the second circuit terminals. For example, the preliminary pressing may be performed under about 1 to about 2 MPa at 60 to 80° C. for about 1 to about 2 sec, and the final pressing may be performed under about 2 to about 5 MPa at 180 to 190° C. for about 4 to about 10 sec.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Preparative Example 1

Formation of Conductive Layer

A binder system consisting of 7 wt % of an NBR resin (N-34, Nippon Zeon), 40% by weight of a polyurethane binder (UN5500, Negami), and 28 wt % of an alkyl methacrylate resin (weight average molecular weight=90,000 g/mol, acid value=2 KOHmg/mg), which is a copolymer of MMA, BA, and cyclohexyl methacrylate, as an acrylic binder, in toluene/methyl ethyl ketone (30 vol %) was prepared. A curable system consisting of 12 wt % of a urethane acrylate (UN5507, Negami), 7.5 wt % of 2-hydroxyethyl (meth)acrylate as a reactive monomer, and 3 wt % of insulated conductive particles (Sekisui) having a size of 3 μm as conductive particles was prepared. 2.5 wt % of lauryl peroxide was used as a curing initiator. A mixture of the binder system, the curable system, the curing initiator, and the conductive particle was used to form a conductive layer. The melt viscosity of the conductive layer was measured at 100° C. using an ARES G2 rheometer (TA Instruments) under the following conditions: heating rate=10° C./min, strain=5%, frequency=1 rad/s, temperature zone=30-180° C. For measurement of the melt viscosity, a parallel plate and a disposable aluminum plate (diameter=8 mm) were used. The conductive layer was found to have a melt viscosity of 4,000 Pa·s at 100° C.

Preparative Example 2

Formation of Insulating Layer

A binder system consisting of 7 wt % of an NBR resin (N-34, Nippon Zeon), 20 wt % of a polyurethane binder (UN5500, Negami) and 9 wt % of an acrylic binder (AOF-7000, Aekyung Chemical) was prepared. A curable system consisting of 56 wt % of a urethane acrylate (NPC7007, Nanux Inc.) and 5.5 wt % of 2-hydroxyethyl 0(meth)acrylate as a reactive monomer, in toluene/methyl ethyl ketone (30 vol %) was prepared. 2.5 wt % of lauryl peroxide was used as a heat curing initiator. A mixture of the binder system, the curable system, and the curing initiator was used to form an insulating layer. The melt viscosity of the insulating layer was measured by the same method as described in Preparative Example 1. The insulating layer was found to have a melt viscosity of 400 Pa·s at 100° C.

Preparative Example 3

Formation of Conductive Layer

A conductive layer was formed in the same manner as in Preparative Example 1, except that the polyurethane binder, the acrylic binder, and the urethane acrylate were used in amounts of 36 wt %, 20 wt %, and 24 wt %, respectively. The melt viscosity of the conductive layer was measured by the same method as described in Preparative Example 1. The conductive layer was found to have a melt viscosity of 2,000 Pa·sat 100° C.

Preparative Example 4

Formation of Conductive Layer

A conductive layer was formed in the same manner as in Preparative Example 1, except that the polyurethane binder, the acrylic binder, and the urethane acrylate were used in amounts of 20 wt %, 15 wt %, and 45 wt %, respectively. The melt viscosity of the conductive layer was measured by the same method as described in Preparative Example 1. The conductive layer was found to have a melt viscosity of 6,000 Pa·sat 100° C.

Preparative Example 5

Formation of Insulating Layer

An insulating layer was formed in the same manner as in Preparative Example 2, except that the polyurethane binder, the acrylic binder, and the urethane acrylate were used in amounts of 20 wt %, 20 wt %, and 45 wt %, respectively. The melt viscosity of the insulating layer was measured by the same method as described in Preparative Example 1. The insulating layer was found to have a melt viscosity of 1,200 Pa·s at 100° C.

Example 1B

Production of Anisotropic Conductive Film

As illustrated in FIG. 5, the conductive layer formed in Preparative Example 1 and the insulating layer formed in Preparative Example 2 were sequentially laminated on a polyethylene terephthalate film as a base film to produce an anisotropic conductive film.

Example 2B

Production of Anisotropic Conductive Film

As illustrated in FIG. 5, the conductive layer formed in Preparative Example 3 and the insulating layer formed in Preparative Example 2 were sequentially laminated on a polyethylene terephthalate film as a base film to produce an anisotropic conductive film.

Comparative Example 1B

Production of Anisotropic Conductive Film

As illustrated in FIG. 4, the insulating layer formed in Preparative Example 2 and the conductive layer formed in Preparative Example 1 were sequentially laminated on a polyethylene terephthalate film as a base film to produce an anisotropic conductive film.

Comparative Example 2B

Production of Anisotropic Conductive Film

As illustrated in FIG. 5 the conductive layer formed in Preparative Example 4 and the insulating layer formed in Preparative Example 5 were sequentially laminated on a polyethylene terephthalate film as a base film to produce an anisotropic conductive film.

Details of the anisotropic conductive films produced in Examples 1B and 2B and Comparative Examples 1B and 2B are shown in Table 1B.

TABLE 1B

|  |  | Example 1B | Example 2B | Comparative Example 1B | Comparative Example 2B |
|---|---|---|---|---|---|
| Conductive layer | Prep. Example | Preparative Example 1 | Preparative Example 3 | Preparative Example 1 | Preparative Example 4 |
|  | Melt viscosity (Pa · s) | 4,000 | 2,000 | 4,000 | 6,00 |
| Insulating layer | Prep. Example | Preparative Example 2 | Preparative Example 2 | Preparative Example 2 | Preparative Example 5 |
|  | Melt viscosity (Pa · s) | 400 | 400 | 400 | 1,200 |
| Melt-viscosity ratio* |  | 10 | 5 | 10 | 0.5 |
| Structure |  | FIG. 5 | FIG. 5 | FIG. 4 | FIG. 5 |

Melt-viscosity ratio * indicates the ratio of the melt viscosity of the conductive layer at 100° C. to that of the insulating layer at 100° C.

Experimental Example 1

Measurement of Physical Properties of Anisotropic Conductive Films

The physical properties of the anisotropic conductive films produced in Examples 1B and 2B and Comparative Examples 1B and 2B were measured by the following methods. The results are shown in Table 2B.

<Methods for Measurement of Physical Properties>

1. Adhesive strength: Each of the anisotropic conductive films was bonded to metal electrode glass (Mo/Al/Mo structure) (Samsung Electronics) and a chip on film (COF) (Samsung Electronics) at a temperature of 185° C. for 4 sec. The 90° peel strength of the anisotropic conductive film was measured using a universal testing machine (UTM).

2. Effective particles: Each of the anisotropic conductive films was bonded to metal electrode glass (Mo/Al/Mo structure) (Samsung Electronics) and a chip on film (COF) (Samsung Electronics) at a temperature of 185° C. for 4 sec. Images of thirty areas of the electrode were taken using a microscope. The numbers of indentations on the areas were averaged to calculate the number of effective particles.

3. Appearance: Each of the anisotropic conductive films was bonded to metal electrode glass (Mo/Al/Mo structure) (Samsung Electronics) and a chip on film (COF) (Samsung Electronics) at a temperature of 185° C. for 4 sec. The appearance of the anisotropic conductive film was visually observed under a microscope.

4. Reliability: Each of the anisotropic conductive films was bonded to metal electrode glass (Mo/Al/Mo structure) (Samsung Electronics) and a chip on film (COF) (Samsung Electronics) at a temperature of 185° C. for 4 sec. After standing in a chamber at 85° C./85% RH for 250 hr, the appearance of the anisotropic conductive film was observed by the same method as described in 3.

5. Preliminary pressing: Each of the anisotropic conductive films was allowed to stand at 25° C. for 1 hr. Four specimens of the anisotropic conductive film were preliminarily pressed to metal electrode glass (Mo/Al/Mo structure) (Samsung Electronics) and chip on films (COFs) (Samsung Electronics) under 1 MPa at different temperatures of 50, 60, 70 and 80° C. for 1 sec. Each specimen was left standing for 30 min. The specimen was judged to be '+' when the base film was easily removed and was judged to be '−' when a portion of the specimen was separated together with the base film or was detached from the glass surface.

6. Area ratio after pressing: Glass substrates were placed on and under a sample (size: 1.5 mm×30 mm) of each of the anisotropic conductive films, followed by pressing at 5 MPa (based on the sample area) and 185° C. (based on the detection temperature of the anisotropic conductive film) for 4 sec. After pressing, the ratio of the area of the insulating layer to that of the conductive layer (based on the outermost particles of the conductive particles) was measured.

TABLE 2B

|  | Example 1B | Example 2B | Comp. Example 1B | Comp. Example 2B |
|---|---|---|---|---|
| Adhesive strength (gf/cm) | 822 | 787 | 819 | 498 |
| Effective particles (ea.) | 24 | 22 | 25 | 15 |
| Appearance | Normal | Normal | Normal | Bubbles observed |
| Reliability | Normal | Normal | Normal | Many bubbles observed |
| Pressing (at 50° C.) | + | + | − | − |
| Pressing (at 60° C.) | + | + | − | − |
| Pressing (at 70° C.) | + | + | − | + |
| Pressing (at 80° C.) | + | + | − | + |
| Area ratio after pressing | 1.32 | 1.44 | 1.28 | 0.93 |

As may be seen from the results in Table 2B, the base film was not easily removed from the film of Comparative Example 1B, in which the base film, the insulating layer and the conductive layer were laminated in this order as illustrated in FIG. 4, at the preliminary pressing temperatures of 50-80° C. Further, the film of Comparative Example 2B, in which the insulating layer had a melt viscosity higher than that of the conductive layer, showed poor preliminary pressing results and was disadvantageous in terms of the number of effective particles, adhesive strength, and reliability after bonding.

By way of summation and review, anisotropic conductive films refer to film-like adhesives in which conductive particles such as metal particles or metal-coated plastic particles are dispersed. Anisotropic conductive films are widely used in various application fields, for example, circuit connections in the field of flat panel displays and component mounting in the field of semiconductor devices. When an anisotropic conductive film is located between circuits, followed by hot pressing under suitable conditions, circuit terminals facing each other may be electrically connected by conductive particles, and an insulating adhesive resin may be filled in spaces between the circuits and the adjacent circuits to make the conductive particles independent from each other, providing insulation performance between the circuit terminals. As a result, high insulation performance may be imparted to the anisotropic conductive film. Anisotropic conductive films may be used for electrical connection between liquid crystal display (LCD) panels and tape carrier packages (TCPs) and between printed circuit boards (PCBs) and TCPs.

With the recent trend toward large and thin displays in the industry, pitches between electrodes and between circuits have become finer. The use of a general monolayer-structured anisotropic conductive films may have limitations in the connection of fine circuit terminals. Information technology (IT) devices have become smaller in size and thickness and lighter in weight, and the resolution of flat panel displays has been gradually increasing. Thus, there has been an increasing demand for narrower circuit widths in such devices. However, conductive particles present in layers to connect the circuits may tend to aggregate, which may cause an electrical shorting. Multilayered anisotropic conductive films have been proposed. However, a multilayered anisotropic conductive film may include a layer having a low melt viscosity. Thus, conductive particles included in the layer may not be positioned between circuit terminals and instead may flow into adjacent spaces, causing short-circuiting or an increase in connection resistance. Also, the multilayered anisotropic conductive film may exhibit relatively poor adhesive strength between circuit members. Further, high transparency of an insulating layer free from the conductive particles may make it difficult to recognize the presence of the anisotropic conductive film after the film is preliminarily pressed against the circuit members.

When the anisotropic conductive film is used to fabricate a display, it may be placed on and fixed to the glass by hot pressing and may be preliminarily pressed to remove the release film. This procedure may help increase the number of conductive particles positioned on the circuit terminals, but the insulating layer adjacent to the release film may be melted and attached to the release film during preliminary pressing due to its higher melt viscosity, rendering the release film difficult to remove.

As described above, embodiments relate to an electronic device including an anisotropic conductive film which includes an insulating layer and a conductive layer laminated on the insulating layer and containing conductive particles. The lowest melt viscosity of the conductive layer may be greater than that of the insulating layer. Embodiments may provide an electronic device that may be prevented from short-circuiting between conductive particles, may achieve decreased connection resistance, may provide good adhesive strength between circuit members, and may have improved recognizability.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:

1. An electronic device, comprising:
an anisotropic conductive film, the anisotropic conductive film including an insulating layer and a conductive layer laminated on the insulating layer, the conductive layer containing insulating particles and conductive particles, wherein,
the lowest melt viscosity of the insulating layer is in the range of about 2,000 Pa·s to about 10,000 Pa·s and the lowest melt viscosity of the conductive layer is in the range of about 5,000 to about 50,000 Pa·s, provided that the lowest melt viscosity of the conductive layer is at least about 3,000 Pa·s greater than that of the insulating layer,
the insulating layer is from greater than 1 to about 4 times thicker than the conductive layer,
the insulating layer is formed from a first composition that comprises a first polymer resin, a first radically polymerizable material, and a first radical initiator, wherein the first polymer resin includes one or more of an olefinic resin, a butadiene resin, an acrylonitrile-butadiene copolymer, a carboxyl-terminated acrylonitrile-butadiene copolymer, a polyimide resin, a polyamide resin, a polyester resin, a polyvinyl butyral resin, an ethylene-vinyl acetate copolymer, a styrene-butylene-styrene (SBS) resin, a styrene-ethylene-butylene-styrene (SEBS) resin, an acrylonitrile-butadiene rubbers (NBRs), a urethane resin, a (meth)acrylic resin, or a phenoxy resin, and the first radically polymerizable material includes a first epoxy (meth)acrylate oligomer, the first epoxy (meth)acrylate oligomer being present in an amount of 20 to 40 wt %, based on a total weight of the first composition,
the conductive layer is formed from a second composition that comprises a second polymer resin, a second radically polymerizable material, and a second radical initiator, wherein the second polymer resin includes one or more of an olefinic resin, a butadiene resin, an acrylonitrile-butadiene copolymer, a carboxyl-terminated acrylonitrile-butadiene copolymer, a polyimide resin, a polyamide resin, a polyester resin, a polyvinyl butyral resin, an ethylene-vinyl acetate copolymer, a styrene-butylene-styrene (SBS) resin, a styrene-ethylene-butylene-styrene (SEBS) resin, an acrylonitrile-butadiene rubbers (NBRs), a urethane resin, a (meth)acrylic resin, or a phenoxy resin, and the second radically polymerizable material includes a second epoxy (meth)acrylate oligomer, the second epoxy (meth)acrylate oligomer being present in an amount of 20 to 30 wt %, based on a total weight of the second composition,
a size of the conductive particles is in the range of about 1 to about 30 µm, the conductive particles being present in an amount of about 1 to about 30% by weight, based on the total weight of the second composition,
a size of the insulating particles is in the range of about 0.1 to about 20 µm, the insulating particles being present in an amount of about 2 to about 20% by weight, based on the total weight of the second composition.

2. The electronic device as claimed in claim 1, wherein the lowest melt viscosity of the conductive layer is about 3,000 to about 48,000 Pa·s greater than that of the insulating layer.

3. The electronic device as claimed in claim 1, wherein the insulating layer includes insulating particles.

4. The electronic device as claimed in claim 3, wherein the insulating particles are present in an amount of about 0.1 to about 20% by weight, based on the total weight of a composition for the insulating layer.

5. The electronic device as claimed in claim 4, wherein the amount (% by weight) of the insulating particles in the conductive layer with respect to the total weight of the composition for the conductive layer is higher than that of the insulating particles in the insulating layer with respect to the total weight of the composition for the insulating layer.

6. The electronic device as claimed in claim 3, wherein the insulating particles are present in an amount of about 0.1 to about 10% by weight, based on the total weight of a composition for the insulating layer.

7. The electronic device as claimed in claim 1, wherein:
the first radically polymerizable material is present in the first composition in an amount of about 20 to about 60% by weight, based on the total weight of the first composition, and
the second radically polymerizable material is present in the second composition in an amount of about 20 to about 60% by weight, based on the total weight of the second composition.

8. The electronic device as claimed in claim 1, wherein the first composition further includes a silane coupling agent, and the silane coupling agent is present in an amount of about 0.1 to about 5% by weight, based on the total weight of the first composition.

* * * * *